United States Patent

Oyamada

[11] Patent Number: 5,969,943
[45] Date of Patent: Oct. 19, 1999

[54] DEVICE HAVING AN EFFICIENT HEAT RADIATION CASING

[75] Inventor: Takashi Oyamada, Tokyo, Japan

[73] Assignee: NEC Corporation, Tokyo, Japan

[21] Appl. No.: 09/169,947

[22] Filed: Oct. 13, 1998

[30] Foreign Application Priority Data

Oct. 13, 1997 [JP] Japan ................................. 9-279166

[51] Int. Cl.⁶ ............................................ H05K 7/20
[52] U.S. Cl. ........................ 361/695; 361/690; 361/697; 361/704; 257/722; 174/16.1; 174/16.3; 165/80.3
[58] Field of Search ..................... 361/690, 694, 361/695, 697, 704; 257/721, 722; 174/16.1, 16.3; 165/80.3

[56] References Cited

U.S. PATENT DOCUMENTS 5,523,918  6/1996  Chiou ........................................ 361/695
5,597,034  1/1997  Barker, III et al. .................... 165/80.3

FOREIGN PATENT DOCUMENTS 61-208296   9/1986   Japan .
4-32300     2/1992   Japan .
8-321571   12/1996   Japan .

Primary Examiner—Leo P. Picard
Assistant Examiner—Boris L. Chervinsky
Attorney, Agent, or Firm—Foley & Lardner

[57] ABSTRACT

A communication device for use in a base station of a portable telephone system has a radiation section including a spiral projection formed on an external surface of a casing to define a spiral air passage on the casing, a fan disposed on the casing inside a central space of the spiral passage, and a motor disposed inside the casing to drive the fan through a shaft penetrating the wall of the casing. A spiral air flow generated by the fan functions for efficient heat radiation through the casing. The spiral projection is formed by drawing the wall of the casing.

4 Claims, 4 Drawing Sheets

DEVICE HAVING AN EFFICIENT HEAT RADIATION CASING

BACKGROUND OF THE INVENTION (a) Field of the Invention

The present invention relates to a device having an efficient heat radiation casing and, more particularly, to a device having an efficient radiation casing of a closed structure, for use as a communication device in a base station of a portable telephone system.

(b) Description of the Related Art

Telecommunication devices for use in base stations of a portable telephone system have been remarkably reduced in their dimensions, resulting from the recent development of the semiconductor technology. Accordingly, the amount of heat generated per unit area inside the communication device is significantly increased, which requires an efficient heat radiation from the device. On the other hand, the number of closed type telecommunication devices including waterproofing has increased because these devices are installed outside more and more frequently with the reduction of the dimensions.

Referring to FIG. 1 showing a conventional communication device mounted on a pole 12 with a pair of straps 13, the communication device 30 has a casing 31 with a radiator 32 mounted on the back surface thereof. Referring additionally to FIG. 2 showing a partial sectional view of the communication device of FIG. 1, taken along a horizontal plane, the radiator 32 is attached to the casing 31 for radiating the heat generated in a heat source 26 toward outside the casing 31. A gasket 33 is inserted between the casing 31 and the outer periphery of the radiator 32 for assuring a waterproof function.

The radiator 32 is generally made by machining a drawn aluminum bar, which raises the cost of the device. The natural radiation of the device through the radiator 32 and the casing 31 requires a large external surface area of the device, which raises the external dimensions and the weight of the device. In particular, the radiation efficiency depends on the wind velocity around the device, wherein a small wind velocity reduces the radiation efficiency.

The radiator 32 has a plurality of grooves for air flow, which limits the allowable posture of the casing 31 so that the grooves of the radiator 32 extend in the vertical direction.

Referring to FIG. 3 showing a sectional view of another conventional communication device, the communication device has a casing 41 separated by a heat insulator plate 42 into two chambers 43 and 44. The chamber 44 receives therein a main power circuit 52 which radiates a large amount of heat, whereas the chamber 43 receives therein a control circuit 51 such as a printed circuit board, which radiates a smaller amount of heat and is less heat-resistant compared to the main power circuit 52. A fan 53 is installed in the chamber 44, with a radiator 54 such as a fin attached to a portion of the casing 41 for the chamber 44. The communication device of FIG. 3 is described in JP-A-4-32300.

The proposed device, however, requires a large external surface area for heat radiation, and the fan 53 and the radiator 54 increase the dimensions of the communication device. In addition, the control circuit 51 is significantly affected by the heat generated in the main power circuit 52 notwithstanding the improved structure.

SUMMARY OF THE INVENTION

It is an object of the present invention to provide an apparatus having a new and improved heat radiation structure, for use as a closed type communication device in a base station of a portable telecommunication system, which has a simple structure and small dimensions and is not limited in its posture for mounting.

The present invention provides an apparatus comprising a casing having an external surface, a spiral projection formed on the external surface to form a spiral air passage on the external surface, the spiral air passage including a central space, an inner air inlet portion communicated with the central space and an outer air outlet portion, a fan disposed in the central space.

In accordance with the apparatus of the present invention, the heat generated inside the casing can be effectively radiated through the wall of the casing by the function of the spiral air passage and the associated fan.

The above and other objects, features and advantages of the present invention will be more apparent from the following description, referring to the accompanying as drawings.

PREFERRED EMBODIMENTS OF THE INVENTION

Now, the present invention is more specifically described with reference to accompanying drawings.

Figure 1:
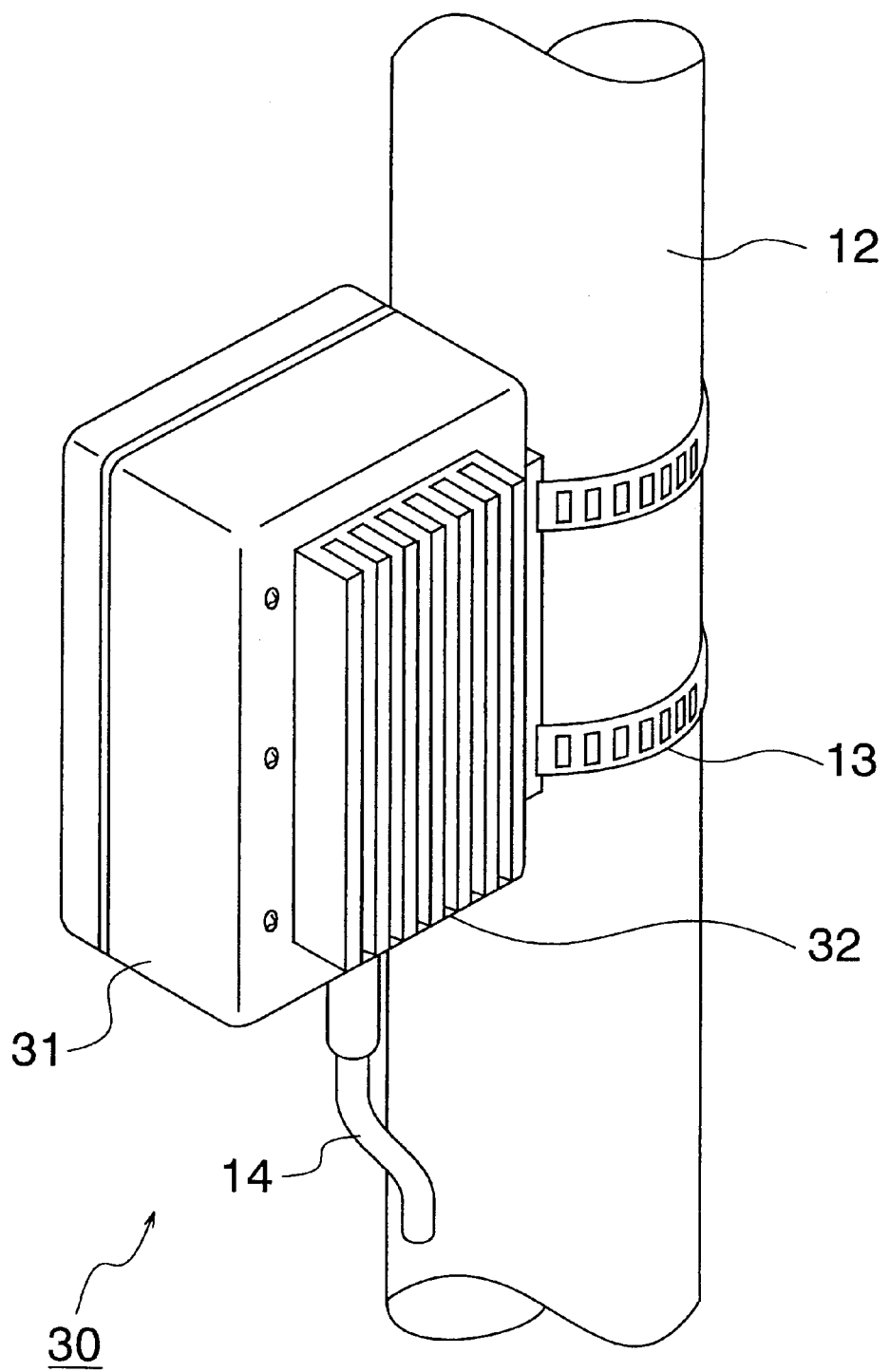
FIG. 1 is a perspective view of a conventional communication device.
Figure 2:
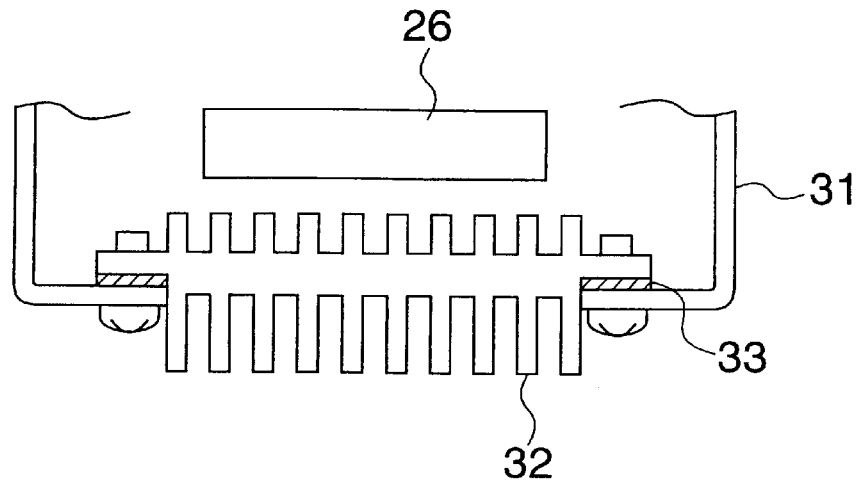
FIG. 2 is a partial sectional view of the communication device of FIG. 1.
Figure 3:
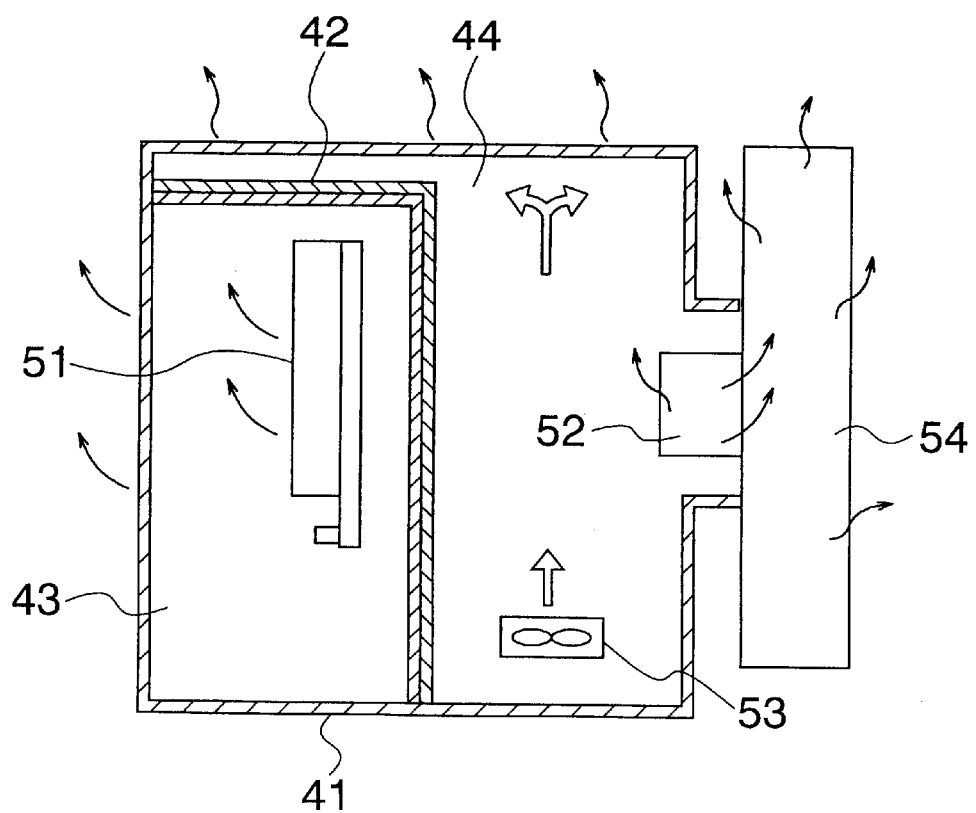
FIG. 3 is a sectional view of another conventional communication device.
Figure 4:
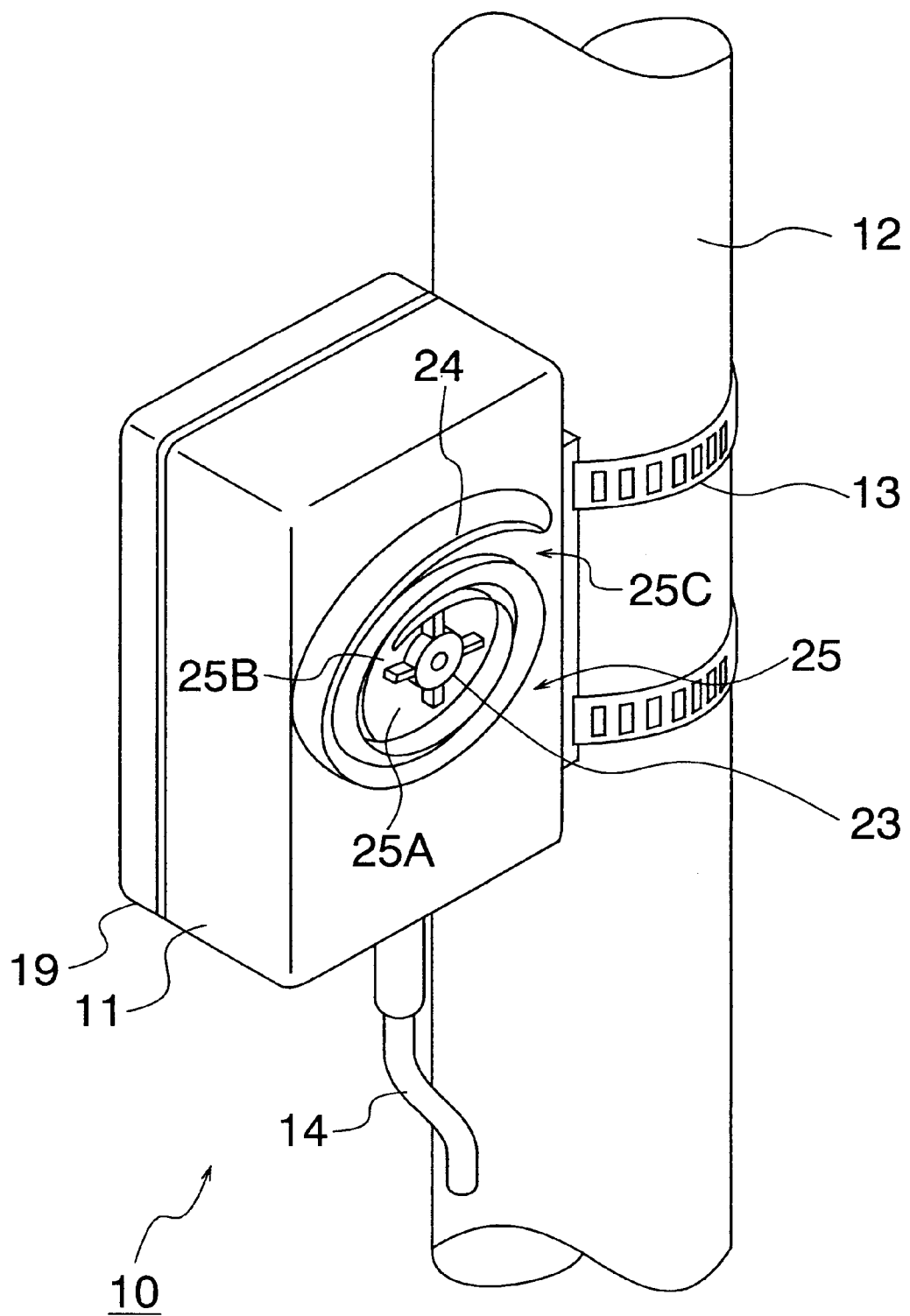
FIG. 4 is a perspective view of a communication device as an apparatus according to an embodiment of the present invention.

Referring to FIG. 4, a communication device, generally designated by numeral 10 and shown as an example of the apparatus according to an embodiment of the present invention, includes a casing 11 suited for mounting the device on a pole 12 with a pair of straps 13, and a front cover 19 attached to the casing 11 with a hinge. The casing 11 has a spiral air passage 25 on the rear wall thereof. The spiral air passage is formed by a spiral projection 24 protruding from the rear wall of the casing 11. The spiral air passage 25 has a central flat space 25A for receiving therein a fan 23 and functions as an air intake portion, an inner air inlet 25B communicated with the central flat space 25A for receiving air from the central flat space 25A, and an outer air outlet 25C for discharging the air from the spiral air passage 25. A cable 14 extends from the casing 11 through the bottom wall thereof.

Figure 5:
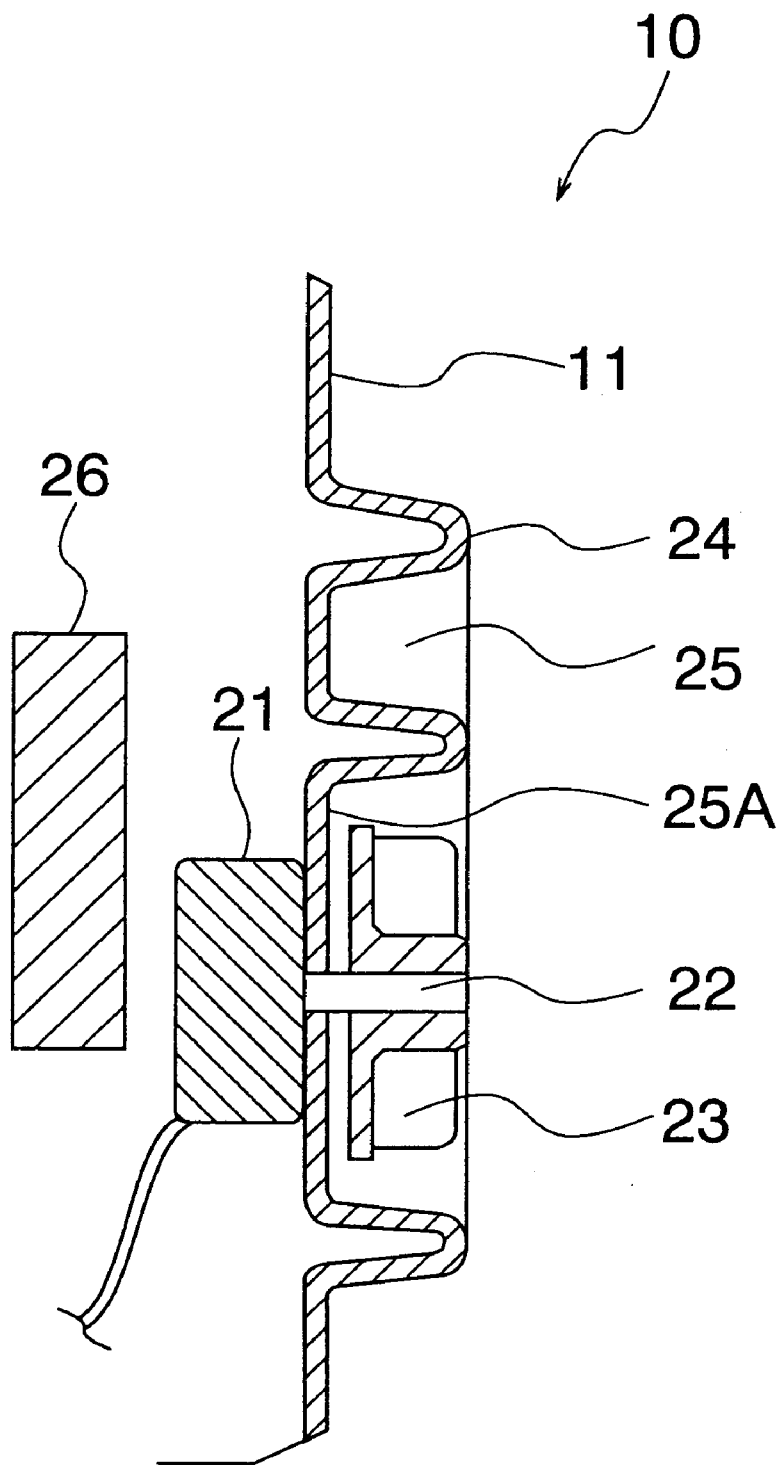
FIG. 5 is a sectional view of the communication device of FIG. 4.

Referring to FIG. 5 showing a vertical-sectional view of the communication device of FIG. 4, taken along the center line of the casing 11, a motor 21 is mounted on the inner surface of the rear wall of the casing 11, with a shaft 22 extending from the motor 21 and penetrating through the rear wall of the casing 11 at the center of the central flat space 25A. The fan 23 is mounted on the other end of shaft 22 outside the casing 11. The spiral projection 24 is formed by drawing the rear wall of the casing 11 in this embodiment. Alternatively, the spiral projection 24 may be formed by welding or bonding a spiral plate onto the rear wall. The center of the spiral air passage 25 coincides with the center of the shaft 22.

In operation of the fan 23 by the motor 21, air is taken in by the fan 23 from the rear side of the casing 11 to flow through the spiral air passage 25 as a spiral air flow which is substantially parallel to the rear wall of the casing 11. The spiral air flow is discharged partly from the outer air outlet 25C of the spiral air passage 25 and partially from the open top of the spiral air passage 25. The heat generated in the main power circuit 26 of the communication device is irradiated through the surface of the spiral projection 24 by the air convection and the heat conduction inside the casing 11 and by the spiral air flow.

In general, in order to improve the heat radiation efficiency of a device, the surface area for the heat radiation should be increased. That is, the area in which the air inside the casing contacts with the casing should be increased. In this view point, the communication device of the present embodiment employs the drawing of the rear wall, wherein a spiral portion of the rear wall is raised by drawing to form a spiral space inside the casing 11. This structure increases the inner surface area of the casing through which the heat is radiated.

The spiral air flow improves the heat radiation through the wall of the casing. The portion of the rear wall of the casing at which the shaft penetrates may be sealed against water. The outer end of the spiral projection 24 should have the structure shown in FIG. 4, wherein the outer end of the spiral projection 24 overhangs the outer air outlet 25C of the spiral air passage 25 and is directed slightly downward for protection of the communication device against rain.

The number of spiral air passages and the associated fans may be determined based on the amount of heat generated inside the casing. The casing may be made of aluminum in view of the heat radiation efficiency and the weight of the casing. The motor may be any motor driven by electrical or mechanical power.

Since the above embodiments are described only for examples, the present invention is not limited to the above embodiments and various modifications or alterations can be easily made therefrom by those skilled in the art without departing from the scope of the present invention.

What is claimed is:

1. An apparatus comprising a casing having an external surface, a spiral projection formed on said external surface to form a spiral air passage on said external surface, said spiral air passage including a central space, an inner air inlet portion communicated with said central space and an outer air outlet portion for discharging air from the spiral air passage, and a fan disposed in said central space.

2. An apparatus as defined in claim 1, further comprising a motor disposed inside said casing for driving said fan.

3. An apparatus as defined in claim 1, wherein said spiral projection is formed by drawing said casing.

4. An apparatus as defined in claim 1, further comprising a communication circuit inside said casing.

\* \* \* \* \*